(12) United States Patent
Martin

(10) Patent No.: US 6,420,193 B1
(45) Date of Patent: *Jul. 16, 2002

(54) REPAIR OF FILM HAVING AN SI-O BACKBONE

(75) Inventor: Jeremy Isaac Martin, Austin, TX (US)

(73) Assignee: Advance Micro Devices, Inc., Sunnyvale, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/527,777

(22) Filed: Mar. 17, 2000

(51) Int. Cl.$^7$ ................................................ H01L 21/00
(52) U.S. Cl. ........................................... 438/4; 438/800
(58) Field of Search .......................... 438/4, 543–546, 438/535–542, 758, 765, 800

(56) References Cited

U.S. PATENT DOCUMENTS

| | | |
|---|---|---|
| 5,371,026 A | 12/1994 | Hayden et al. |
| 5,472,913 A | 12/1995 | Havemann et al. |
| 5,552,344 A | 9/1996 | Jang et al. |
| 5,849,640 A | 12/1998 | Hsia et al. |
| 5,937,308 A | 8/1999 | Gardner et al. |
| 6,028,015 A * | 2/2000 | Wang et al. .................. 438/789 |

FOREIGN PATENT DOCUMENTS

| WO | 97/41592 | 11/1997 |
|---|---|---|

* cited by examiner

*Primary Examiner*—Charles Bowers
*Assistant Examiner*—Craig Thompson

(57) ABSTRACT

Damaged low-density silicon oxide-based films having an Si—O backbone are repaired using a method for driving a self-limiting healing process. According to an example embodiment of the present invention, a deposition precursor and an oxidizer are introduced to a damaged side wall region of a low-density silicon oxide-based film. The unstable damaged portion of the film reacts with the deposition precursor and a thin repair film is grown within the interfacial layer of the damaged film. The repair film provides a strengthened interface, protects the underlying sensitive material from further chemical damage, and can improve the ability to integrate the film.

26 Claims, 2 Drawing Sheets

REPAIR OF FILM HAVING AN SI-O BACKBONE

FIELD OF THE INVENTION

The present invention relates generally to semiconductor wafers and their fabrication and, more particularly, to semiconductor wafers and their manufacture involving techniques for repairing damaged silicon oxide.

BACKGROUND OF THE INVENTION

The semiconductor industry has recently experienced technological advances that have permitted dramatic increases in circuit density and complexity, and equally dramatic decreases in power consumption and package sizes. Present semiconductor technology now permits single-chip microprocessors with many millions of transistors, operating at speeds of hundreds of millions of instructions per second to be packaged in relatively small, air-cooled semiconductor device packages. Such technological advances are coupled with heightened complexity of the manufacturing process and increasingly higher standards of reliability, performance, and consistency of semiconductor wafers.

As the manufacturing processes for semiconductor wafers become more complex, and as product standards for such wafers increase, methods for manufacturing and repairing these wafers become increasingly important. Not only is it important to ensure that individual chips are functional, it is also important to ensure that batches of chips perform consistently and meet performance standards. In addition, as technology advances, the cost of manufacturing the high tech wafers increases. The increased cost of wafers results in greater losses when the wafers are defective and must be thrown out.

A particular problem typically found in the manufacture of semiconductor devices and wafers is the damaging of low-density films during processing, such as during etch, photoresist removal, and ashing processes. Low-density films susceptible to such damage include, for example, materials having a low dielectric constant such as those based on an Si—O backbone and having other substituents of composition SiOxRyHz, where $1<=x<=2$, R is an organic group such as a methyl or ethyl, $0<=y<=2$, and $0<=z<=2$. During these processes, bonds in the low-density material can be broken, chemical species are sometimes selectively removed, and the material can become susceptible to further damage during additional processing. These and other problems result in semiconductor wafers and devices having performance, reliability, and other problems.

SUMMARY OF THE INVENTION

The present invention is directed to the repair of a semiconductor wafer during its manufacture, and is exemplified in a number of implementations and applications, some of which are summarized below.

According to an example embodiment of the present invention, a semiconductor having damaged low-density film based on an Si—O backbone is repaired in a manner that addresses the problems described in the Background of the Invention hereinabove. An $SiO_2$ deposition precursor, such as silane, and an oxidizer, such as $O_2$ or $N_2O$, are introduced to a damaged portion of a film having a silicon oxide backbone in the wafer. The deposition precursor reacts with the damaged film, and a thin silicon dioxide layer is grown within the damaged film. The thin silicon dioxide leads to the repair of wafer damage in manners including inducing the passivation of the reactive species or the densification of the interfacial area.

The above summary of the present invention is not intended to describe each illustrated embodiment or every implementation of the present invention. The figures and detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
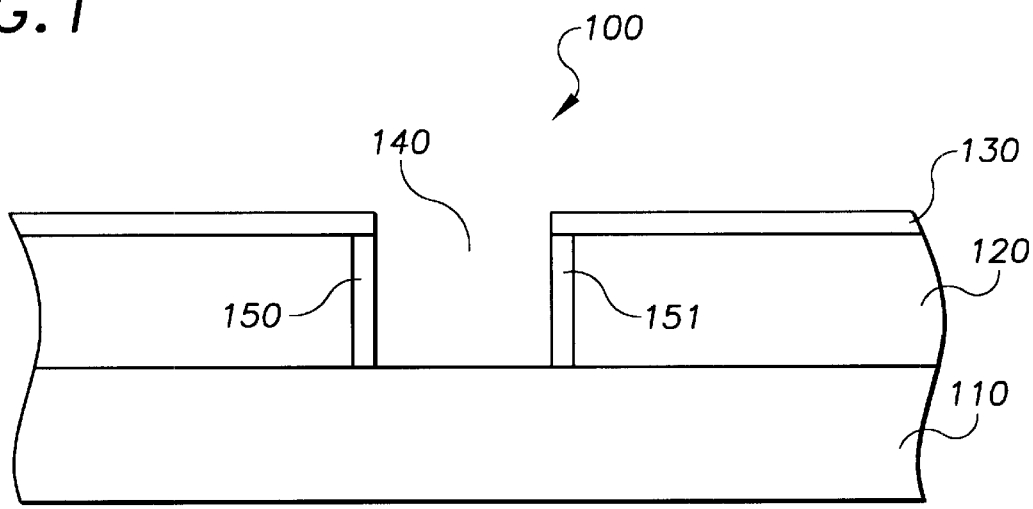
FIG. 1 is a damaged semiconductor wafer for use in connection with the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor wafers, and the invention has been found to be particularly suited for wafers having low-density Si—O backbone-based films that are susceptible to damage. While the present invention is not necessarily limited to such wafers, various aspects of the invention may be appreciated through a discussion of various examples using this context.

In connection with an example embodiment of the present invention, it has been discovered that damaged low-density silicon oxide films in a semiconductor wafer can be repaired and/or improved by introducing a deposition precursor for silicon dioxide, such as silane, and an oxidizer to the damaged wafer. For example, damage can occur to the interfacial layer of a side wall of a trench or via during processes such as etching, ashing, or photoresist removal. Typical damage includes broken bonds such as Si—C and Si—H bonds, the selective removal of chemical species, and the general degradation of the properties of the interfacial layer. Immediately after such damage occurs, the film is in a reactive state. By introducing a deposition precursor for silicon dioxide and an oxidizer to the damaged portion of the film, a reaction occurs and a thin silicon dioxide skin is grown inside the damaged interfacial layer. The silicon dioxide skin acts to repair the film and has added benefits, such as the strengthening and densification of trench walls before or after processing, and can achieve these benefits without the unwanted effect of collapsed profiles.

This is useful for various types of low dielectric films having an Si—O based backbone. For example, typical films that can be repaired using the method and system described herein include those having substituents of the composition SiOxRyHz in combination with the Si—O backbone, wherein:

R is an organic group such as a methyl or ethyl;
$1 \leq x \leq 2$;
$0 \leq y \leq 2$; and
$0 \leq z \leq 2$.

These films may be deposited using, for example, spin on techniques or plasma-enhanced chemical-vapor-deposition (PECVD). Examples of spin on materials are Silsesquioxanes including Hydrogen Silsesquioxane (HSQ) such as FOX available from Dow-Corning, Methyl Silsesquioxane (MSQ), Sol gel materials including xerogels such as Nanogalss by Allied Signal and XLK from Dow Coming, templated or otherwise self-organized materials, inorganic-organic hybrids, or inorganic materials having sacrificial porogen components. Examples of films deposited using PECVD include films based on various methyl silane precursors such as mono, di, tri or tetra methyl silane, Black Diamond available from Applied Materials, Coral film available from Novellus, or other materials based on more complex Si containing precursors.

FIG. 1 shows a portion 100 of a semiconductor wafer at a stage in a manufacturing process, according to an example embodiment of the present invention. A low-density silicon oxide-based film 120 having a dense silicon dioxide cap 130 is formed over a substrate 110. Typical low-density silicon oxide-based films include those described hereinabove that are deposited using techniques such as PECVD and spin on techniques. A trench 140 having side wall portions 150 and 151 is formed in the film 120. During processing, such as etching, ashing, or plasma-assisted photoresist removal, the side wall portions 150 and 151 are damaged.

Figure 2:
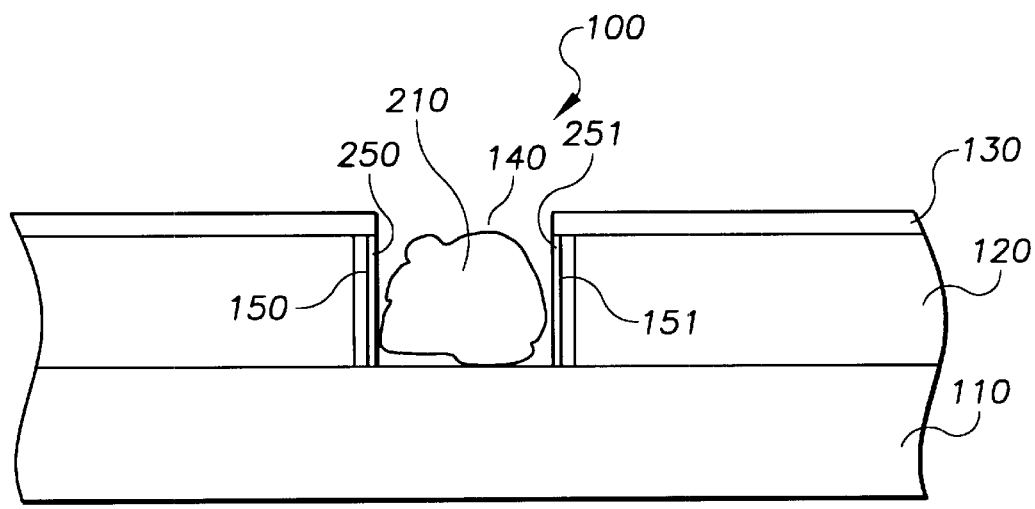
FIG. 2 is the semiconductor wafer of FIG. 1 undergoing a process step, according to an example embodiment of the present invention.

In FIG. 2, a gas 210 containing a deposition precursor and an oxidizer are introduced to the trench region 140 immediately after the damage occurs and while the side wall portions 150 and 151 are in a reactive state. The gas 210 reacts with the damaged regions, passivates some or all of the reactive side walls, and forms reconstructed regions 250 and 251 within the side wall portions 150 and 151. The reconstructed regions act to repair the damaged regions and provide benefits including protecting the underlying low density silicon from further damage, improving the ability to integrate the region for further processing, strengthening the wall, densifying the wall, passivating the reactive species, and preventing diffusion.

Several types of deposition precursors and oxidizers can be used to achieve desired results. For example, typical silicon dioxide-based precursors, such as Silane or Tetra Ethyl Ortho Silicate (TEOS), with an appropriate oxidizer, such as $N_2O$ or $O_2$, can be used under conditions that produce a very low deposition rate that is marginal for bulk deposition, such as with low or no RF power on, or with conditions otherwise selected to minimize the deposition rate. Minimizing the deposition rate is useful because the trenches have already been etched, and any deposition on the bottom of the trench will have to be removed before the barrier metal is deposited to ensure good electrical contact. In addition, the repair film generally has a higher dielectric constant than the material in the trench wall, and keeping the film thin minimizes the resulting increase in dielectric constant. Maintaining a low dielectric constant is desirable because it helps to limit line to line capacitance. Other gases, such as nitrogen or silicon carbide deposition precursors, can also be used to achieve particular results. For instance, a silicon carbide layer can be formed on the trench wall to create a copper diffusion barrier. The silicon carbide layer is formed by PECVD deposition of trimethyl silane and helium.

According to another example embodiment of the present invention, a controlled thickness of the interfacial layer is further damaged after being repaired, and the further damaged region is then subsequently repaired. In one implementation, the interfacial layer is damaged using a separate damage process, wherein a controlled thickness between about 10 and 500 Angstroms is damaged. In another implementation, the interfacial layer is damaged using a damage process that is part of another manufacturing procedure, such as photoresist removal, etching, or ashing. In either case, a passivation gas such as a silicon dioxide deposition precursor is delivered to the damaged region, reacts with the damaged region, and forms a repaired area having improved strength and resistance to further processing damage.

The additional damage step, whether performed as a separate step or as part of another manufacturing step, may be performed at one or several points in the manufacturing process. For example, the additional damage step can be performed during or after the etch, ash, or photoresist removal processes. The damage can be effected in the etch chamber, in the ash reactor, in an additional chamber on the same mainframe (which allows the additional damage to be performed without breaking vacuum), or in a different tool altogether. In another example embodiment, the damage and repair steps are performed at several points in the manufacturing process, resulting in the repair being performed in stages.

In another example embodiment of the present invention, a system is adapted for repairing a semiconductor chip having damaged silicon film, using methods such as described herein above. The system includes a deposition arrangement adapted to introduce a deposition precursor and an oxidizer to damaged silicon film in a chip. The deposition precursor is reacted with the damaged silicon film and a thin repair film is grown. In one example implementation, the system includes a commonly available chamber, such as an etch or an ash chamber, adapted to deliver the gasses relevant to silicon oxide repair.

Figure 3:
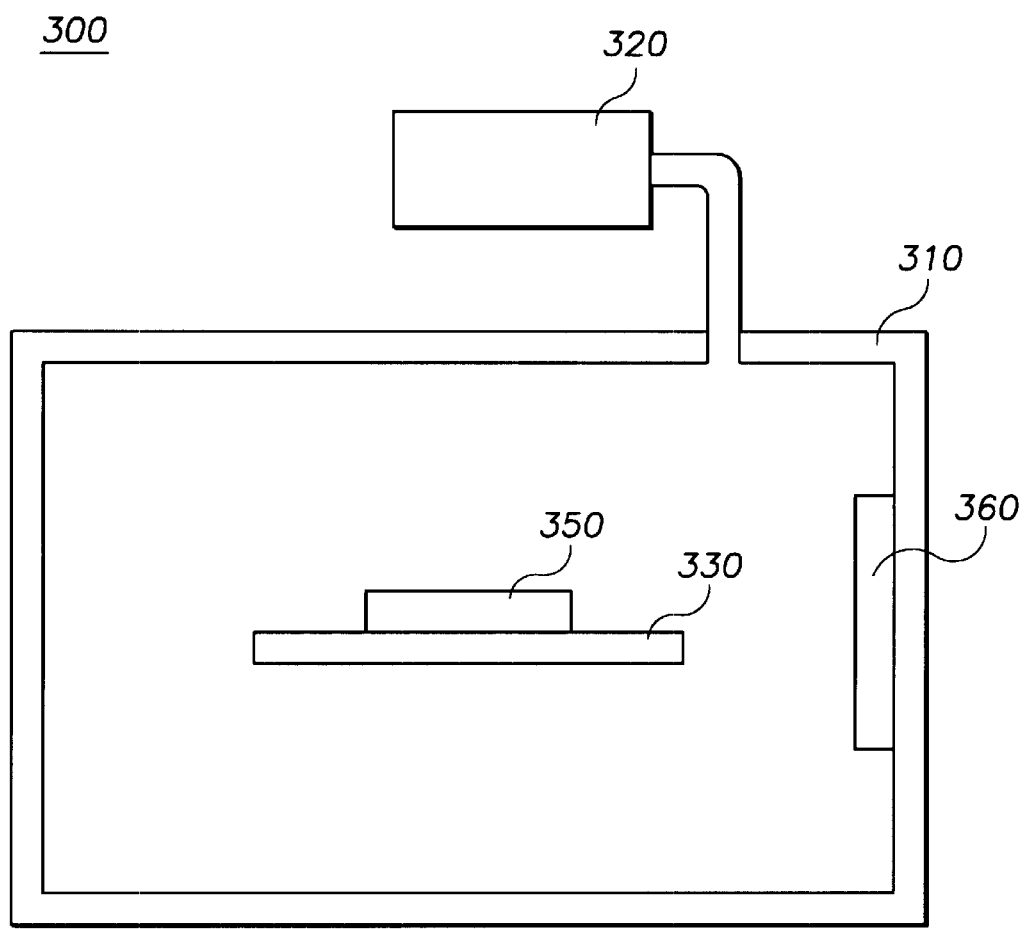
FIG. 3 is a system for repairing damaged substrate in a semiconductor chip, according to another example embodiment of the present invention.

FIG. 3 shows a system 300 arranged for repairing a semiconductor wafer, according to another example embodiment of the present invention. The system includes a repair chamber 310 coupled to a gas supply 320 adapted to supply a gas including a deposition precursor and an oxidizer to a wafer 350 located on a wafer holder 330. Optionally, a plasma generator 360 is used to generate plasma from the deposition precursor in the chamber. The gas reacts with the damaged film and a thin repair film is grown within the damaged silicon film.

The repair may be accomplished using various combinations of chambers and at various stages in manufacturing process. For example, in one implementation, the repair chamber 310 of FIG. 3 further includes an etching arrangement adapted to etch the wafer, and in another example implementation, the chamber 310 includes an ashing arrangement adapted to ash the wafer. In each of the etch and ashing example implementations, the gas supply 320 can be used to supply a gas during or after an etch or ash process.

In still another example implementation, the repair chamber is coupled to a mainframe having an etch chamber adapted to etch the wafer. The system is further adapted to draw a vacuum on the etch and repair chambers and to transfer the wafer from the etch chamber to the repair chamber without breaking the vacuum.

While the present invention has been described with reference to several particular example embodiments, those skilled in the art will recognize that many changes may be made thereto without departing from the spirit and scope of the present invention, which is set forth in the following claims.

What is claimed is:

1. A method for repairing damaged low-density silicon oxide film in a semiconductor wafer, the method comprising:
   introducing a deposition precursor and an oxidizer to the damaged film; and
   growing a thin repair film within the damaged film, wherein the damaged silicon reacts with the deposition precursor to grow the film.

2. The method of claim 1, wherein introducing a deposition precursor to the damaged film includes introducing at least one of: Silane, Tetra Ethyl Ortho Silicate (TEOS), a silicon dioxide deposition precursor, and a silicon carbide deposition precursor.

3. The method of claim 1, wherein introducing a deposition precursor and an oxidizer to the damaged film includes introducing the deposition precursor and oxidizer to a trench side wall.

4. The method of claim 1, wherein the deposition rate of the deposition precursor is marginal for bulk deposition.

5. The method of claim 1, wherein the deposition rate of the thin repair film is about 20 Angstroms per second.

6. The method of claim 1, further comprising:
   damaging an interface layer of a controlled thickness; and
   treating the damaged layer with a passivating gas and rendering the layer strengthened and inert to further process damage.

7. The method of claim 6, wherein damaging an interface layer includes damaging the interface layer during another wafer processing procedure.

8. The method of claim 6, wherein damaging an interface layer includes damaging the interface layer as a separate step in the repair of the semiconductor wafer.

9. The method of claim 6, wherein damaging an interface layer of a controlled thickness includes damaging an interface layer having a thickness of about 10–500 Angstroms.

10. The method of claim 6, wherein the passivating gas includes a silicon dioxide deposition precursor.

11. The method of claim 8, wherein damaging an interface layer of a controlled thickness includes damaging the interface layer after etch and before photo-resist removal.

12. The method of claim 8, wherein damaging an interface layer of a controlled thickness includes damaging the interface layer after etch and after partial photo-resist removal.

13. The method of claim 8, wherein damaging an interface layer of a controlled thickness includes damaging the interface layer after etch and photo-resist removal have been completed.

14. The method of claim 7, wherein treating the damaged layer with a passivating gas includes treating the damaged layer during an etching process.

15. The method of claim 7, wherein treating the damaged layer with a passivating gas includes treating the damaged layer after an etching process.

16. The method of claim 7, wherein treating the damaged layer with a passivating gas includes treating the damaged layer during resist removal.

17. The method of claim 7, wherein treating the damaged layer with a passivating gas includes treating the damaged layer after resist removal.

18. The method of claim 8, wherein damaging the interface layer as a separate step in the repair of the semiconductor wafer includes damaging the interface layer in an etch chamber.

19. The method of claim 8, wherein damaging the interface layer as a separate step in the repair of the semiconductor wafer includes damaging the interface layer in an addition chamber on the same mainframe as an etch chamber subsequent to etching the wafer in the etch chamber, wherein the vacuum is not broken after etch.

20. The method of claim 8, wherein damaging the interface layer as a separate step in the repair of the semiconductor wafer includes damaging the interface layer in a different tool from that used in other manufacturing processes.

21. The method of claim 6, wherein damaging an interface layer of a controlled thickness, treating the damaged layer with a passivating gas, and rendering the layer strengthened and inert to further process damage includes damaging and treating the interface layer in several stages during wafer manufacture.

22. A method according to claim 1, wherein the steps of introducing and growing are performed immediately after the low-density silicon oxide film is damaged, and wherein the low-density silicon oxide film is in a reactive state.

23. A method according to claim 1, wherein the deposition precursor and the oxidizer are introduced during another wafer processing step.

24. The method of claim 23, wherein the deposition precursor and oxidizer arc introduced in an ash reactor after the wafer has been ashed.

25. The method of claim 23, wherein the deposition precursor and oxidizer are introduced in an etch reactor after the wafer has been etched.

26. The method of claim 1, wherein the deposition precursor includes a silicon carbide deposition precursor, and wherein growing a thin repair film includes growing a silicon carbide film that acts as a copper diffusion barrier.

* * * * *

UNITED STATES PATENT AND TRADEMARK OFFICE
CERTIFICATE OF CORRECTION

PATENT NO. : 6,420,193 B1  
APPLICATION NO. : 09/527777  
DATED : July 16, 2002  
INVENTOR(S) : Martin Page 1 of 1

It is certified that error appears in the above-identified patent and that said Letters Patent is hereby corrected as shown below:

In the Claims

Please add missing Claim 27 (allowed Claim 40): A method for repairing damaged low-density silicon oxide film in a semiconductor wafer, the method comprising:

introducing a deposition precursor and an oxidizer to the damaged film;

growing a thin repair film within the damaged film, wherein the damaged silicon reacts with the deposition precursor to grow the film and thereby renders an interface layer; and damaging the interface layer and then treating the damaged interface layer to render the interface layer strengthened and inert to farther process damage.

Please add missing Claim 28 (allowed Claim 41): A method for repairing damaged low-density silicon oxide film in a semiconductor wafer, the method comprising:

introducing a deposition precursor and an oxidizer to the damaged film, the deposition precursor including at least one of Silane, Tetra Ethyl Ortho Silicate (TEOS), a silicon dioxide deposition precursor, and a silicon carbide deposition precursor;

growing a thin repair film within the damaged film, wherein the damaged silicon reacts with the deposition precursor to grow the film and thereby renders an interface layer; and damaging the interface layer and then treating the damaged interface layer with the deposition precursor to render the interface layer strengthened and inert to further process damage.

Signed and Sealed this

Fifth Day of December, 2006

JON W. DUDAS  
*Director of the United States Patent and Trademark Office*